(12) United States Patent
Blank et al.

(10) Patent No.: US 8,487,370 B2
(45) Date of Patent: Jul. 16, 2013

(54) TRENCH SEMICONDUCTOR DEVICE AND METHOD OF MANUFACTURING

(75) Inventors: Oliver Blank, Villach (AT); Ralf Siemieniec, Villach (AT); Martin Poelzl, Ossiach (AT); Maximilian Roesch, Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 329 days.

(21) Appl. No.: 12/847,537

(22) Filed: Jul. 30, 2010

(65) Prior Publication Data
US 2012/0025304 A1     Feb. 2, 2012

(51) Int. Cl.
*H01L 21/336* (2006.01)
*H01L 29/78* (2006.01)

(52) U.S. Cl.
USPC ............ 257/330; 257/334; 257/E29.262; 257/E21.41; 257/E29.257; 438/270; 438/589

(58) Field of Classification Search
USPC ........... 257/331, 330, 334, E29.262, E21.41, 257/E29.257; 438/270, 589
See application file for complete search history.

(56) References Cited

U.S. PATENT DOCUMENTS

| | | | |
|---|---|---|---|
| 6,677,205 B2* | 1/2004 | Beintner | 438/270 |
| 7,005,351 B2* | 2/2006 | Henninger et al. | 438/268 |
| 7,414,286 B2 | 8/2008 | Hirler et al. | |
| 2007/0114600 A1 | 5/2007 | Hirler et al. | |
| 2009/0206401 A1 | 8/2009 | Hirler et al. | |
| 2009/0218618 A1 | 9/2009 | Blank et al. | |

FOREIGN PATENT DOCUMENTS
DE    102005041256.4    8/2005

* cited by examiner

*Primary Examiner* — Matthew Reames
*Assistant Examiner* — Benjamin Tzu-Hung Liu
(74) *Attorney, Agent, or Firm* — Murphy, Bilak & Homiller, PLLC

(57) ABSTRACT

A semiconductor device includes a semiconductor body including a trench with first and second opposing sidewalls. A first electrode is arranged in a lower portion of the trench and a second electrode in an upper portion of the trench. A dielectric structure is arranged in the trench, including a first portion between the electrodes. The first portion includes, in sequence along a lateral direction from the first sidewall to the second sidewall, a first part including a first dielectric material, a second part including a second dielectric material selectively etchable to the first dielectric material, a third part including the first dielectric material, the first dielectric material of the third part being continuously arranged along a vertical direction from a top side of the first electrode to a bottom side of the second electrode, a fourth part including the second dielectric material and a fifth part including the first dielectric material.

25 Claims, 11 Drawing Sheets

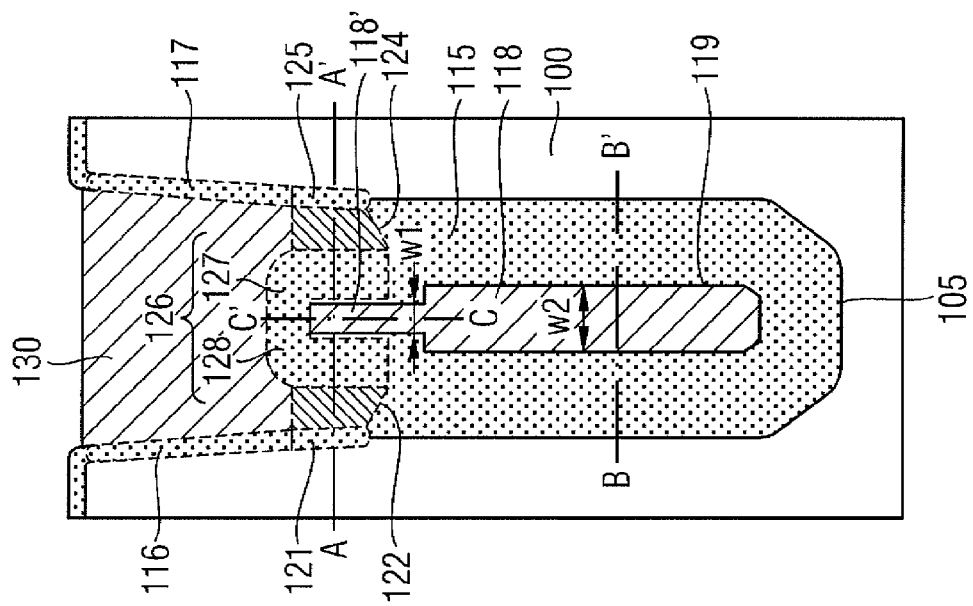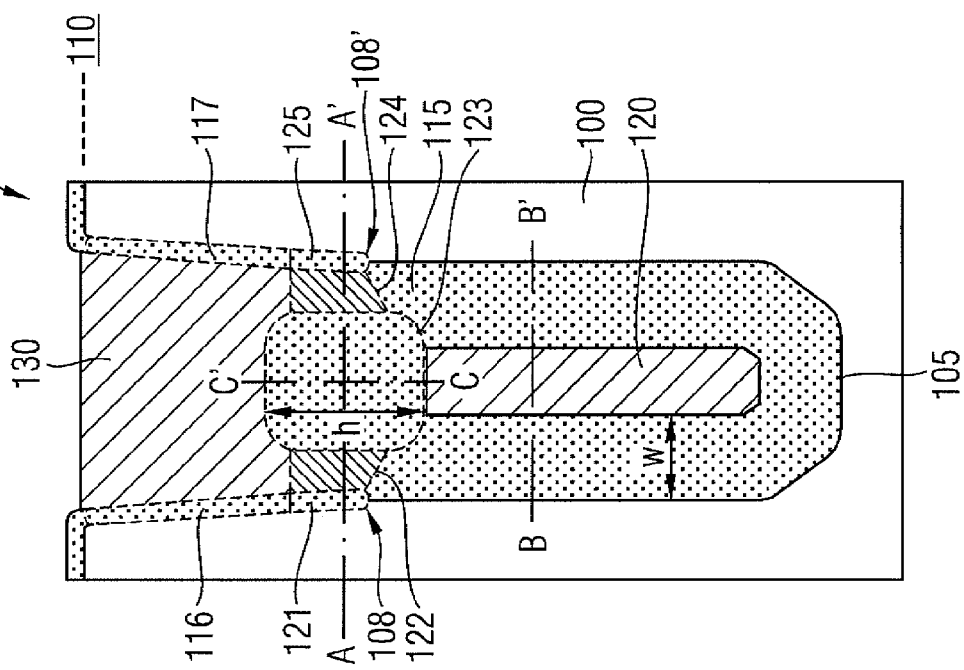

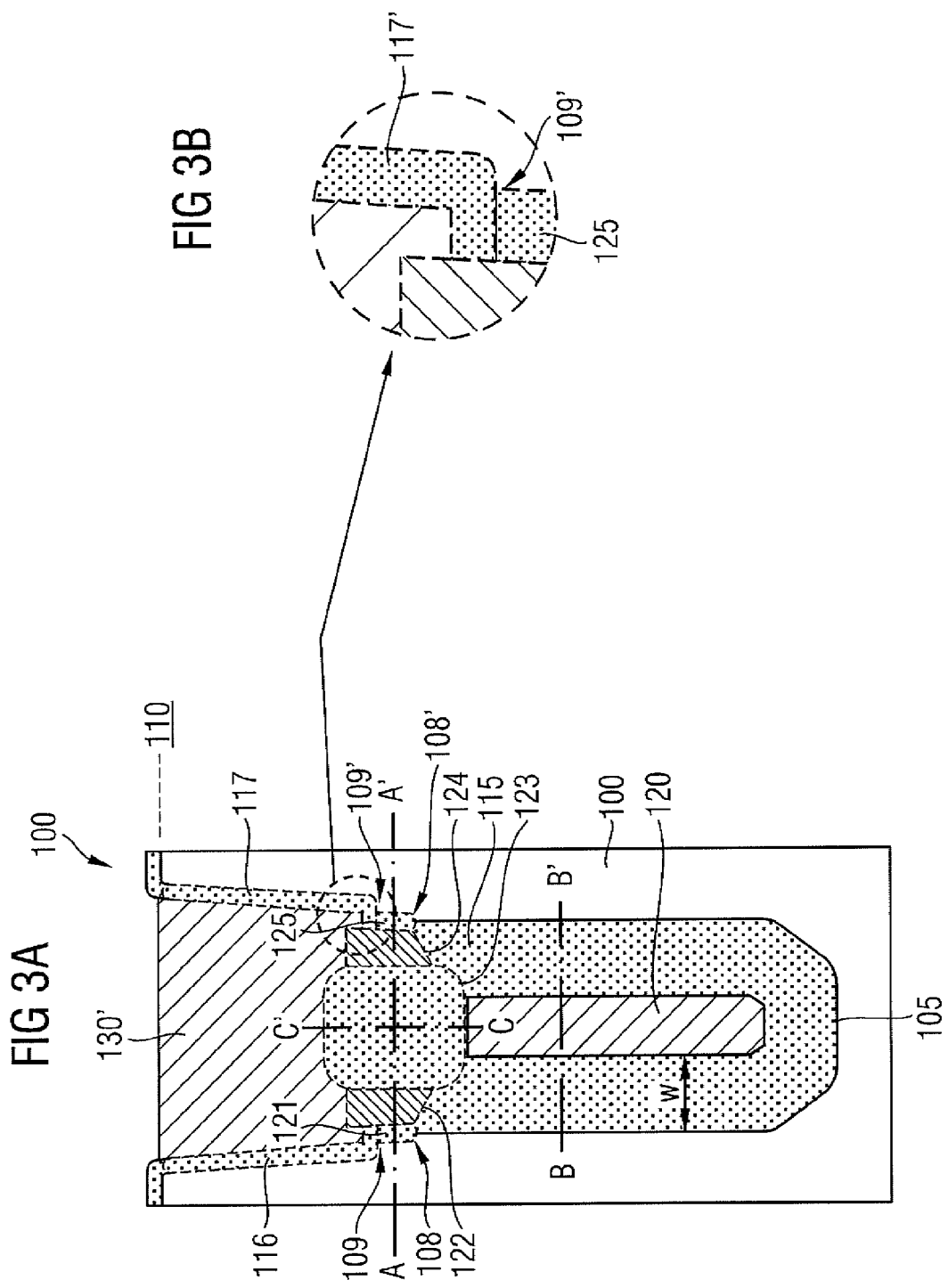

TRENCH SEMICONDUCTOR DEVICE AND METHOD OF MANUFACTURING

BACKGROUND

Trench semiconductor devices such as Trench Field Effect Transistors (Trench FETs) or Trench Insulated Gate Bipolar Transistors (Trench IGBTs) are included in a vast variety of products for semiconductor applications such as automotive, consumer, industrial, power management or motor control and drives. A key parameter of trench semiconductor devices is their reliability. It is desirable to improve the reliability of trench semiconductor devices and to provide a method for manufacturing such devices.

For these and other reasons there is a need for the present invention.

SUMMARY

According to an embodiment of a semiconductor device, the device includes a semiconductor body including a trench, a first sidewall of the trench being opposed to a second sidewall of the trench. The semiconductor device further includes a first electrode in a lower portion of the trench, a second electrode in an upper portion of the trench and a dielectric structure in the trench, the dielectric structure including a first portion between the first electrode and the second electrode. The first portion of the dielectric structure includes, in sequence along a lateral direction from the first sidewall to the second sidewall, a first part including a first dielectric material, a second part including a second dielectric material being selectively etchable to the first dielectric material, a third part including the first dielectric material, the first dielectric material of the third part being continuously arranged along a vertical direction from a top side of the first electrode to a bottom side of the second electrode, a fourth part including the second dielectric material and a fifth part including the first dielectric material.

According to another embodiment of a semiconductor device, the device includes a semiconductor body including a trench, a first sidewall of the trench being opposed to a second sidewall of the trench, a first electrode in a lower portion of the trench, a second electrode in an upper portion of the trench and a dielectric structure in the trench. The dielectric structure includes a third portion between the first sidewall and an upper part of the first electrode, the third portion including, in sequence along a lateral direction from the first sidewall to the upper part of the first electrode, a first part including a first dielectric material, a second part including a second dielectric material being selectively etchable to the first dielectric material and a third part including the first dielectric material. A fourth portion is between the second sidewall and the upper part of the first electrode, the fourth portion including, in sequence along a lateral direction from the second sidewall to the upper part of the first electrode, a fourth part including the first dielectric material, a fifth part including the second dielectric material and a sixth part including the first dielectric material. The first dielectric material is continuously arranged along a vertical direction from a top side of the upper part of the first electrode to a bottom side of the second electrode.

According to a method of manufacturing a semiconductor device, the method includes forming a trench in a semiconductor body, a first sidewall of the trench being opposed to a second sidewall of the trench, forming a first electrode in a lower portion of the trench, forming a second electrode in an upper portion of the trench and forming a dielectric structure in the trench, the dielectric structure including a first portion between the first electrode and the second electrode. The first portion of the dielectric structure includes, in sequence along a lateral direction from the first sidewall to the second sidewall, a first part including a first dielectric material, a second part including a second dielectric material being selectively etchable to the first dielectric material, a third part including a third dielectric material. The first dielectric material of the third part is continuously arranged along a vertical direction from a top side of the first electrode to a bottom side of the second electrode. A fourth part includes the second dielectric material and a fifth part including the first dielectric material.

According to a method of manufacturing a semiconductor device, the method includes forming a trench in a semiconductor body, a first sidewall of the trench being opposed to a second sidewall of the trench, forming a first electrode in a lower portion of the trench, forming a second electrode in an upper portion of the trench and forming a dielectric structure in the trench. The dielectric structure includes a third portion between the first sidewall and an upper part of the first electrode, the third portion including, in sequence along a lateral direction from the first sidewall to the upper part of the first electrode, a first part including a first dielectric material, a second part including a second dielectric material being selectively etchable to the first dielectric material and a third part including the first dielectric material. A fourth portion is between the second sidewall and the upper part of the first electrode, the fourth portion including, in sequence along a lateral direction from the second sidewall to the upper part of the first electrode, a fourth part including the first dielectric material, a fifth part including the second dielectric material and a sixth part including the first dielectric material. The first dielectric material is continuously arranged along a vertical direction from a top side of the upper part of the first electrode to a bottom side of the second electrode.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

FIG. 1 illustrates one embodiment of a cross-section of a portion of a Trench Metal Oxide Semiconductor Field Effect Transistor (Trench MOSFET).

FIG. 2 illustrates another embodiment of a cross-section of a portion of a Trench Metal Oxide Semiconductor Field Effect Transistor (Trench MOSFET).

FIGS. 3A and 3B illustrate yet another embodiment of a cross-section of a portion of a Trench MOSFET.

DETAILED DESCRIPTION

Figure 4:
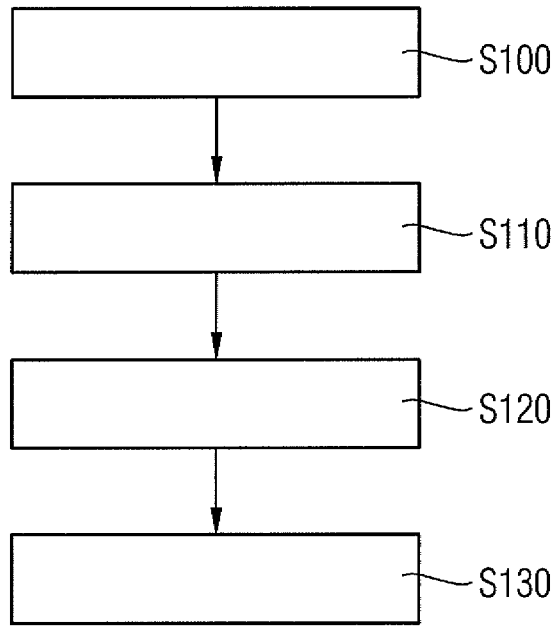
FIG. 4 is a simplified flow chart illustrating one embodiment of a method of manufacturing a trench semiconductor device.

In the following Detailed Description, reference is made to the accompanying drawings, which form a part hereof, and in which is shown by way of illustration specific embodiment in which the invention may be practiced. In this regard, directional terminology, such as "top", "bottom", "front", "back", "leading", "trailing", etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A number of embodiments will be explained below. In this case, identical structural features are identified by identical reference symbols in the figures. In the context of the present description, "lateral" or "lateral direction" should be understood to mean a direction or extent that runs parallel to the lateral extent of a semiconductor material or semiconductor body.

The structures illustrated in the figures are not depicted true to scale but rather serve only for the better understanding of the embodiments.

FIG. 1 illustrates, on the basis of a vertical trench field effect transistor, a portion of a semiconductor body 100 including a trench 105 at a main surface 110.

In one embodiment, the semiconductor body 100 includes silicon. Other materials such as, for example, silicon carbide (SiC) or compound semiconductors are likewise suitable. The semiconductor body 100 may include a semiconductor substrate such as a semiconductor wafer having formed thereon one or more semiconductor layers such as semiconductor layers grown by epitaxy. These semiconductor layers may be arranged at the main surface 110 of the semiconductor body 100.

The trench 105 includes an insulating structure 115. In a lower part of the trench 105, the insulating structure 115 provides an electrical insulation between the semiconductor body 100 and a first electrode 120 in a lower portion of the trench 105. The insulating structure 115 may encompass the first electrode 120. In certain areas of the semiconductor body 100 (not illustrated in FIG. 1) the first electrode 120 may extend to the main surface 110 and be electrically coupled to a wiring area on the main surface 110.

In the lower part of the trench 105, the insulating structure 115 may include an oxide of silicon such as $SiO_2$. A material or material combinations different from an oxide of silicon may also be used. In one embodiment, the insulating structure 115 functions as a field oxide in the lower part of the trench 105 and the first electrode 120 functions as a field electrode.

The first electrode 120 includes one or more conductive materials or combinations thereof. The first electrode 120 may include doped polysilicon and/or doped amorphous silicon.

A second electrode 130 is arranged in an upper part of the trench 105. Similar to the first electrode 120, the second electrode 130 includes one or more conductive materials or combinations thereof. In one embodiment, the first and second electrodes 120, 130 both include doped polysilicon.

Those regions of the insulating structure 115 that are arranged between the sidewalls of the second electrode 130 and the semiconductor body 100 adjoining the trench 105, i.e. regions 116 and 117 of the insulating structure 115 constitute a gate insulator of the FET. Regions 116 and 117 may include a thermal oxide formed by thermal oxidation of the material of the semiconductor body at the respective sidewalls of the trench 105.

The part of the insulating structure 115 arranged between the first electrode 120 and the second electrode 130 includes, in sequence along the lateral direction of line A-A', a first region 121 including a first insulating material corresponding to the material of regions 116, 117, a second region 122 including a second insulating material that is selectively etchable to the first insulating material, a third region 123 including the first insulating material, a fourth region 124 including the second insulating material and a fifth region 125 including the first insulating material.

In one embodiment, the first insulating material is an oxide of silicon such as $SiO_2$ and the second insulating material is a nitride of silicon such as $Si_3N_4$. According to other embodiments, the first and second insulating materials may be different from an oxide and/or nitride of silicon provided that the second insulating material is selectively etchable to the first insulating material.

In one embodiment, a width of the second region 122 along the lateral direction corresponds to the width of the fourth region 124. This width may be within a range of 10 nm to 900 nm, for example. Likewise, the width of the first region 121 along the lateral direction may correspond to the width of the fifth region 125.

According to one embodiment, a height h of the third region 123 along the vertical direction is larger than a width w of the dielectric structure 115 along the lateral direction from a sidewall of the trench 105 to an opposing sidewall of the first electrode 120. As an example, the height h may be approximately 1.2×w+100 nm.

The first insulating material in the first and fifth regions 121, 125 and in the regions 116, 117 may be formed by thermal oxidation of the semiconductor body 100 at the respective sidewall portions of the trench 105. At a bottom side of the first and fifth regions 121, 125 a step in a sidewall profile along the vertical direction of the trench 105 may be present. This step may be due to different widths of the trench 105 along the lateral direction of line A-A' in a part of trench 105 between the first and second electrodes 120, 130 and the lateral direction along line B-B' in a lower part of the trench 105. These different widths may be caused by different processes of forming the insulating structure 115 in the respective parts of trench 105. The first insulating material of the first and fifth regions 121, 125 and the regions 116 and 117 may be formed by thermal oxidation of sidewalls of the semiconductor body 100 leading to a lateral extension of the insulating structure 115 into the semiconductor body by consumption of material of the semiconductor body 100 during thermal oxidation. When forming those parts of the insulating structure 115 by deposition of the insulating material, an extension of the dielectric structure into the semiconductor body 100 is missing in the lower part of the trench 105.

Along the vertical direction of line C-C' the first insulating material of the third region 123 is continuously arranged along from a top side of the first electrode 120 to a bottom side of the second electrode 130. In other words, the third region 123 does not include a stack of different insulating layers.

By including an insulating material in the second and fourth regions 122, 124 instead of a conductive material such as the conductive material of the second electrode, rupture of the insulating structure 115 by electrical overstress at a bottom of the first and fifth regions 121, 125 is less likely compared with a component including a conductive material in the second and fourth regions 122, 124. In latter case, a thin portion at the bottom side of regions 122, 124 being thinner than the remaining sidewall portions may be the cause of rupture of the insulating structure. By including the insulating material in the second and fourth regions 122, 124, a thinnest part of the insulating material at a bottom side 108, 108' of the first and fifth regions 121, 125 is not electrically active. Thus, reliability of the component illustrated in FIG. 1 can be improved.

Furthermore, a capacitance between the first electrode 120 and the second electrode 130 may be reduced compared to a component including the material of the second electrode 130 in second and fourth regions 122, 124. This is because in latter component, an effective distance between the first electrode 120 and the second electrode 130 would be smaller than in the component illustrated in FIG. 1.

The semiconductor device of FIG. 1 may include further elements not illustrated in FIG. 1, e.g., semiconductor regions formed within the semiconductor body 100, such as source, drain and body or a wiring area including metal layers and insulating layers arranged on the main surface 110.

The semiconductor device illustrated in FIG. 2 is similar to the device illustrated in FIG. 1 with regard to the trench 105, the dielectric structure 115 in a lower part of the trench, the first insulating material of the first and fifth regions 121, 125 and in the regions 116, 117, the second insulating material in the second and fourth regions 122, 124 and the second electrode 130.

The semiconductor device of FIG. 2 differs from the one illustrated in FIG. 1 with regard to the first electrode and the third region. Whereas in FIG. 1 a top side of the first electrode 120 is arranged below a bottom side of the first region 122 in the device, in the device illustrated in FIG. 2 the top side of a first electrode 119 is arranged above the bottom side of the first region 122. This is because the first electrode 119 includes a bottom portion 118 similar to the first electrode 120 illustrated in FIG. 1 and it furthermore includes a top portion 118' that is not present in FIG. 1. A width $w_1$ of the top portion 118' along the lateral direction is smaller than the width $w_2$ of the bottom portion 118. When forming the first insulating material of the first, third and fifth regions 121, 126 and 125 by thermal oxidation of the semiconductor body 100 and the first electrode 119, a part of the first electrode 119 may remain in the top portion 118' if the thermal oxidation ends before the conductive material in that portion is completely oxidized. Therefore, the third region 126 includes a first part 127 adjoining a first sidewall of the top portion 118 of the first electrode 119 and a second part 128 adjoining a second sidewall of the top portion 118 of the first electrode 119, the second sidewall being opposed to the first sidewall. In the device of the embodiment illustrated in FIG. 2, the first insulating material of the third region 126 is continuously arranged from a top side of the top portion 118' of the first electrode 119 to a bottom side of the second electrode 130 along the vertical direction of line C-C'. In other words, the third region 126 does not include a stack of different insulating layers from a top side of the top portion 118' of the first electrode 119 to a bottom side of the second electrode 130.

Although a capacitance between the first electrode 119 and the second electrode 130 may be larger than the corresponding capacitance of the first electrode 120 and the second electrode 130 in FIG. 1, the device illustrated in FIG. 2 provides the benefit of an improved reliability by counteracting rupture of the insulating structure 115 at a bottom side of the first and fifth regions 121, 125.

The semiconductor device illustrated in FIGS. 3A and 3B is similar to the device illustrated in FIG. 1. with regard to the trench 105, the dielectric structure 115 in a lower part of the trench and the first to fifth regions 121 to 125 of the dielectric structure 115. While in the device illustrated in FIG. 1 a profile of one sidewall of the trench 105 along the vertical direction includes one step at the bottom side 108 (108') of the first (fifth) region 121 (125), the device illustrated in FIGS. 3A and 3B includes an additional step 109 (109') at the top side of 109 (109') of the first (fifth) region 121 (125). The second step 109 may be caused by an additional thermal oxidation of the trench sidewalls of regions 116, 117 after removal of a previously formed sacrificial thermal oxide. The previously formed thermal oxide remains in and constitutes the first and fifth regions 121, 125 and is only removed from the sidewalls above the first and fifth regions 121, 125.

FIG. 4 is a simplified flow chart illustrating one embodiment of manufacturing a semiconductor device.

At S100 a trench is formed in a semiconductor body, a first sidewall of the trench being opposed to a second sidewall of the trench.

At S110, a first electrode is formed in a lower portion of the trench.

At S120, a second electrode is formed in an upper portion of the trench.

At S130, a dielectric structure is formed in the trench, the dielectric structure including a first portion between the first electrode and the second electrode. The first portion of the dielectric structure includes, in sequence along a lateral direction from the first sidewall to the second sidewall, a first part including a first dielectric material, a second part including a second dielectric material being selectively etchable to the first dielectric material, a third part including the first dielectric material, the first dielectric material of the third part being continuously arranged along a vertical direction from a top side of the first electrode to a bottom side of the second electrode, a fourth part including the second dielectric material and a fifth part including the first dielectric material.

The processes of S100, S110, S120, S130 or part of these processes may be carried out in a sequence different from S100, S110, S120, S130. As an example, part of the process of S130 may be carried out before S110 and a further part of the process of S130 may be carried out after S110 and before S120. In other words, a part of the dielectric structure may be formed within the trench before the first electrode is formed and a further part of the dielectric structure may be formed within the trench after the first electrode is formed and before the second electrode is formed in the upper portion of the trench.

Figure 5:
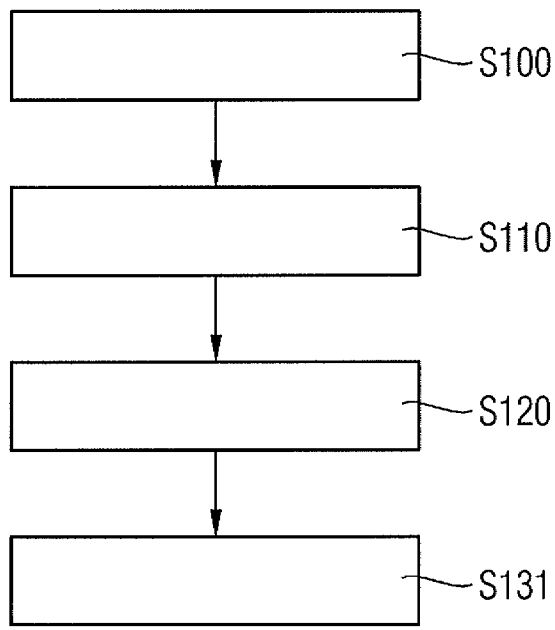
FIG. 5 is a simplified flow chart illustrating another embodiment of a method of manufacturing a trench semiconductor device.

FIG. 5 is a simplified flowchart of another embodiment for manufacturing a semiconductor device. The processes carried out at S100, S110 and S120 correspond to the ones of the embodiment illustrated in FIG. 4.

At S131, a dielectric structure is formed in the trench, the dielectric structure including a third portion between the first sidewall and an upper part of the first electrode, the third portion including, in sequence along a lateral direction from the first sidewall to the upper part of the first electrode, a first part including a first dielectric material, a second part including a second dielectric material being selectively etchable to the first dielectric material, and a third part including the first dielectric material. The dielectric structure furthermore includes a fourth portion between the second sidewall and the upper part of the first electrode, the fourth portion including, in sequence along a lateral direction from the second sidewall to the upper part of the first electrode, a fourth part including the first dielectric material, a fifth part including the second dielectric material and a sixth part including the first dielectric material. The first dielectric material is continuously arranged along a vertical direction from a top side of the upper part of the first electrode to a bottom side of the second electrode.

FIGS. 6 to 13 illustrate cross-sections of a semiconductor body for illustrating one embodiment of a method for manufacturing a semiconductor device.

Figure 6:
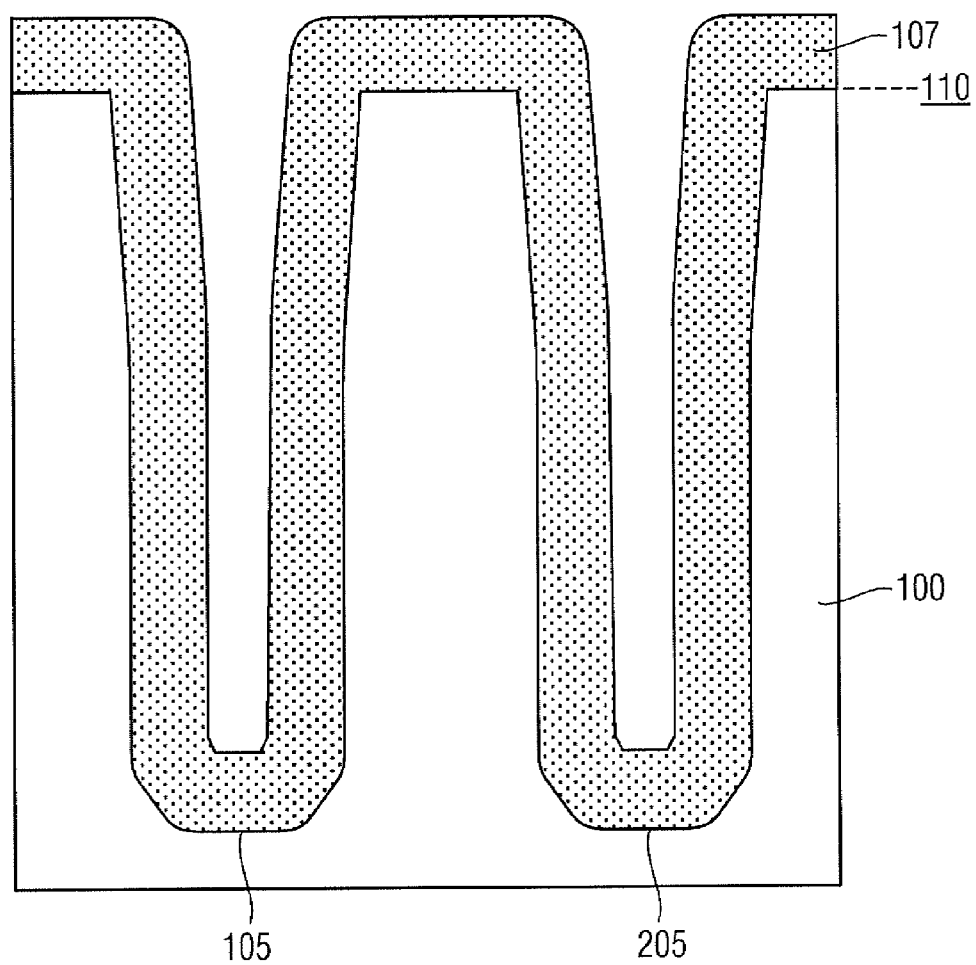
FIG. 6 is a cross-section of a semiconductor body for illustrating one embodiment of a method for manufacturing an insulating layer of a trench semiconductor device.

Referring to FIG. 6, trenches 105, 205 are formed in a semiconductor body 100 at a main surface 110. The trenches 105, 205 may be formed by using anisotropic or isotropic etching, for example. In the illustrated cross-sections the semiconductor body includes silicon. However, other embodiments may also include semiconductor materials different from Si.

Then, a dielectric material 107 such as an oxide of silicon, e.g., $SiO_2$, is formed at sidewalls of the trenches 105, 205, at a bottom side of the trenches 105, 205 and on the main surface 110. A portion of the dielectric material 107 in a lower part of the trenches 105, 205 may function as a field oxide of the finalized device.

Figure 7:
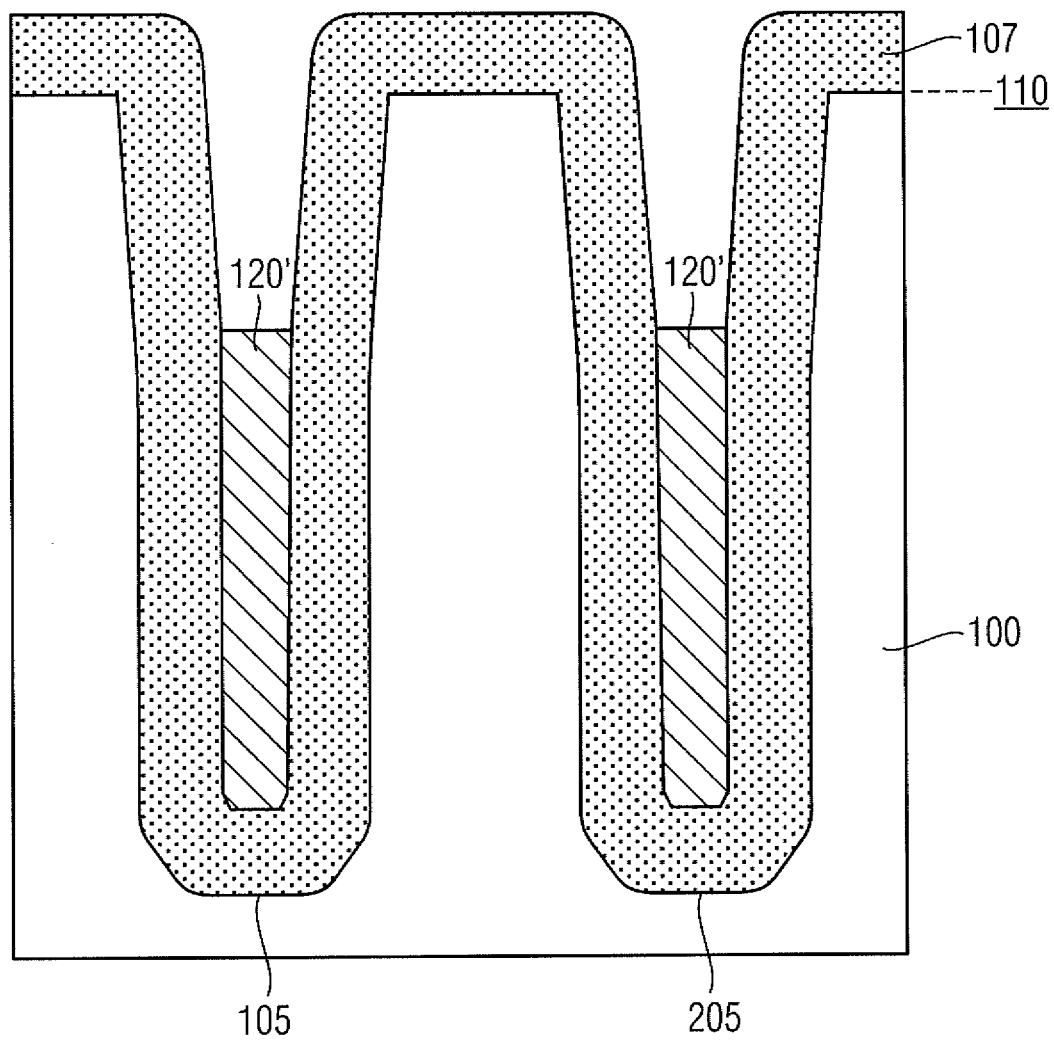
FIG. 7 is a cross-section of a semiconductor body for illustrating the process of forming a first conductive material in the trench.

Then, as is illustrated in FIG. 7, a first electrode material 120' is formed in a lower part of the trenches 105, 205. The first electrode material includes silicon such as doped polysilicon or doped amorphous silicon. The first electrode material 120' may initially fill up the trenches 105, 205 and also cover the main surface 110. Then, this material may be removed from the main surface 110 and an upper part of the trenches 105, 205 by an appropriate process such as etching.

Figure 8:
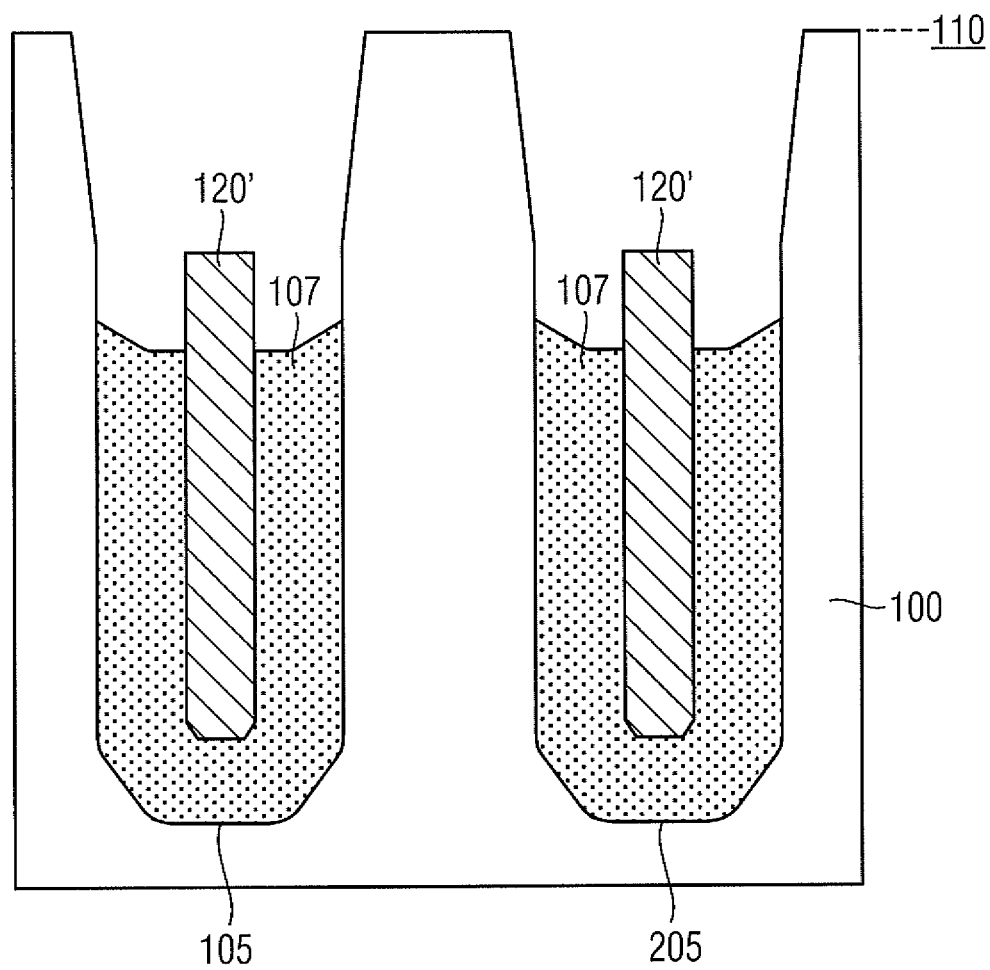
FIG. 8 is a cross-section of a semiconductor body for illustrating the process of selectively removing an insulating material to the first conductive material.

Referring to FIG. 8, the dielectric material 107 is removed from the main surface 107 as well as from the sidewalls of an upper part of the trenches 105, 205 by an appropriate process such as etching, e.g., wet etching. Removal of the dielectric material 107 is stopped after a top side of the remaining dielectric material 107 is below the top side of the first electrode material 120'.

Figure 9:
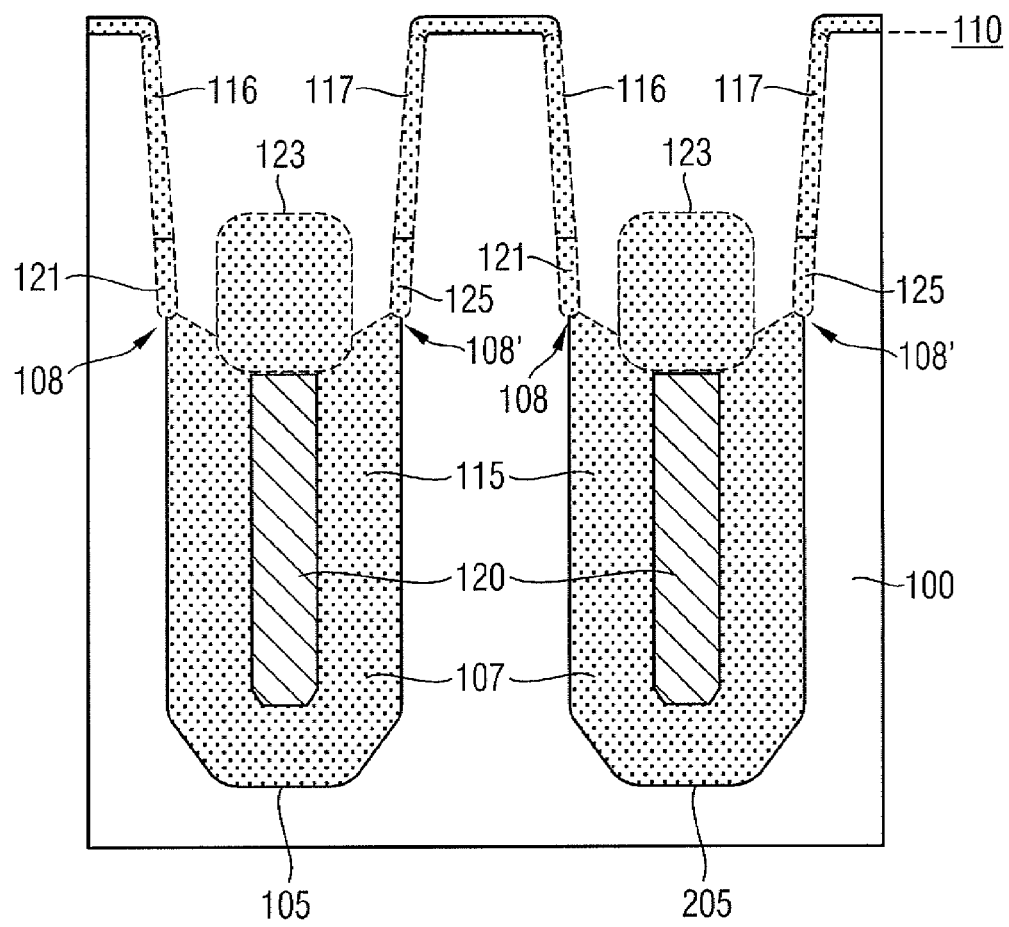
FIG. 9 is a cross-section of a semiconductor body for illustrating the process of thermal oxidation of an upper sidewall portion of the trench and of a first electrode.

Referring to FIG. 9, a thermal oxidation process is carried out. Then, exposed parts of the sidewalls in an upper part of the trenches 105, 205 are oxidized. Likewise, an oxide of silicon is also formed on the main surface 110. The exposed part of the first electrode material 120' illustrated in FIG. 8 is also oxidized. In the embodiment disclosed in FIG. 9, thermal oxidation is not stopped before the exposed part of the first electrode material 120' is completely oxidized along its width, i.e. along the lateral direction. The remaining part of the first electrode material 120' corresponds to the first electrode 120. However, according to other embodiments, thermal oxidation may be stopped before the respective part of the first electrode material 120' is completely oxidized along its width. In this case, an upper part of the first electrode material remains with a lateral width comparatively smaller than the lateral width in the lower part of the first electrode material (cf. embodiment illustrated in FIG. 2).

After thermal oxidation, a dielectric structure 115' in the trenches 105, 205 includes the dielectric material 107 in the lower part of the trenches and an oxide of silicon in regions 116, 117 in the upper part of the trenches 105, 205. The regions 116, 117 function as gate dielectrics of the finalized device. The dielectric structure 115' furthermore includes first, third and fifth regions 121, 123, 125 including the thermal oxide of silicon. First and fifth regions 121, 125 correspond to the lower parts of the thermal oxide at the sidewalls in the upper part of trenches 105, 205 and the third region 123 corresponds to the thermal oxide on top of the first electrode 120. Along the lateral direction, a gap remains between the first and third regions 121, 123 as well as between the third and fifth regions 123, 125.

Because thermal oxidation of sidewalls of trenches 105, 205 is limited to the sidewall portion above the dielectric material 107, a step in a sidewall profile along the vertical direction occurs at a transition 108, 108' between the top side of the dielectric material 107 and the bottom side of the first and fifth regions 121, 125, respectively.

Figure 10:
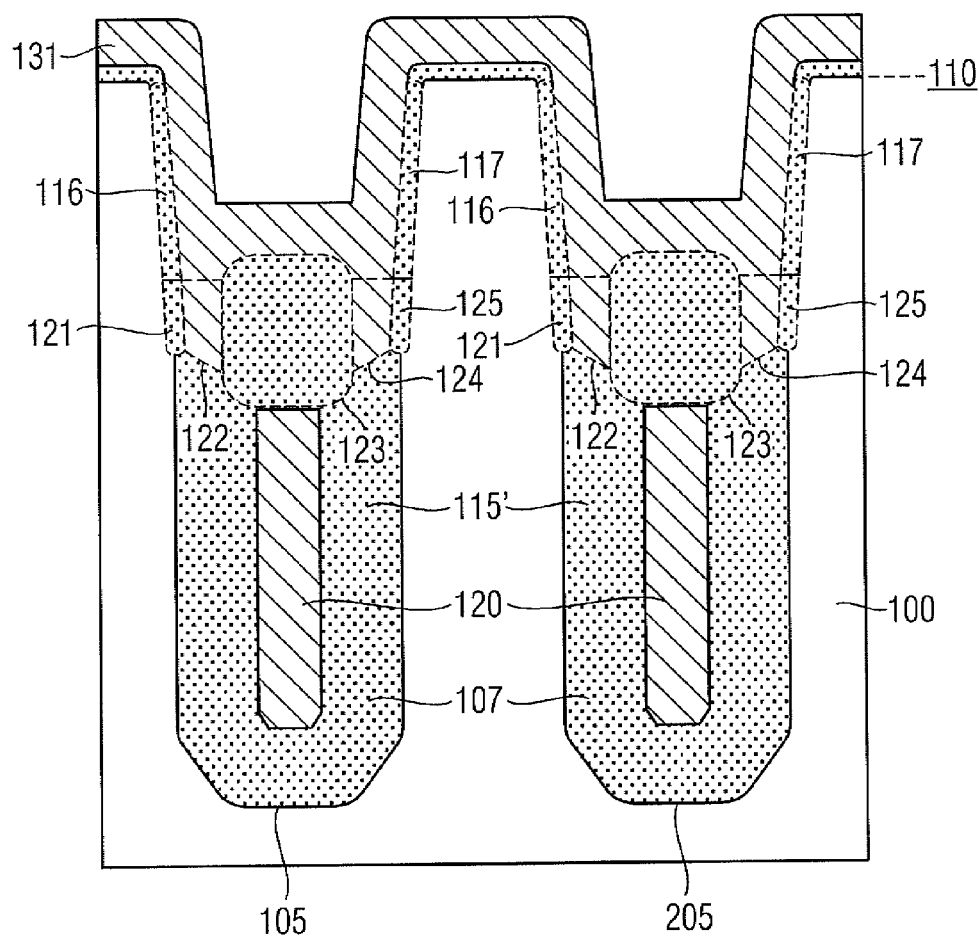
FIG. 10 is a cross-section of the semiconductor body illustrating a process of forming silicon nitride in the trench.

Referring to FIG. 10, an insulating material 131 selectively etchable to the material of the first, third and second regions 121, 123, 125 is formed on the main surface 110 and on the thermal oxide of regions 116, 117, 121, 123, 125. The insulating material fills up a second region 122 between the first and third regions 121, 123 as well as a fourth region 124 between the third and fifth regions 123, 125, respectively. The insulating material 131 may be silicon nitride ($Si_3N_4$) which is selectively etchable to $SiO_2$. It is to be noted that materials different from $SiO_2$ and $Si_3N_4$ may be used provided that the material filling up the second and fourth regions 122, 124 is selectively etchable to the material of the first, third and fifth regions 121, 123, 125.

Figure 11:
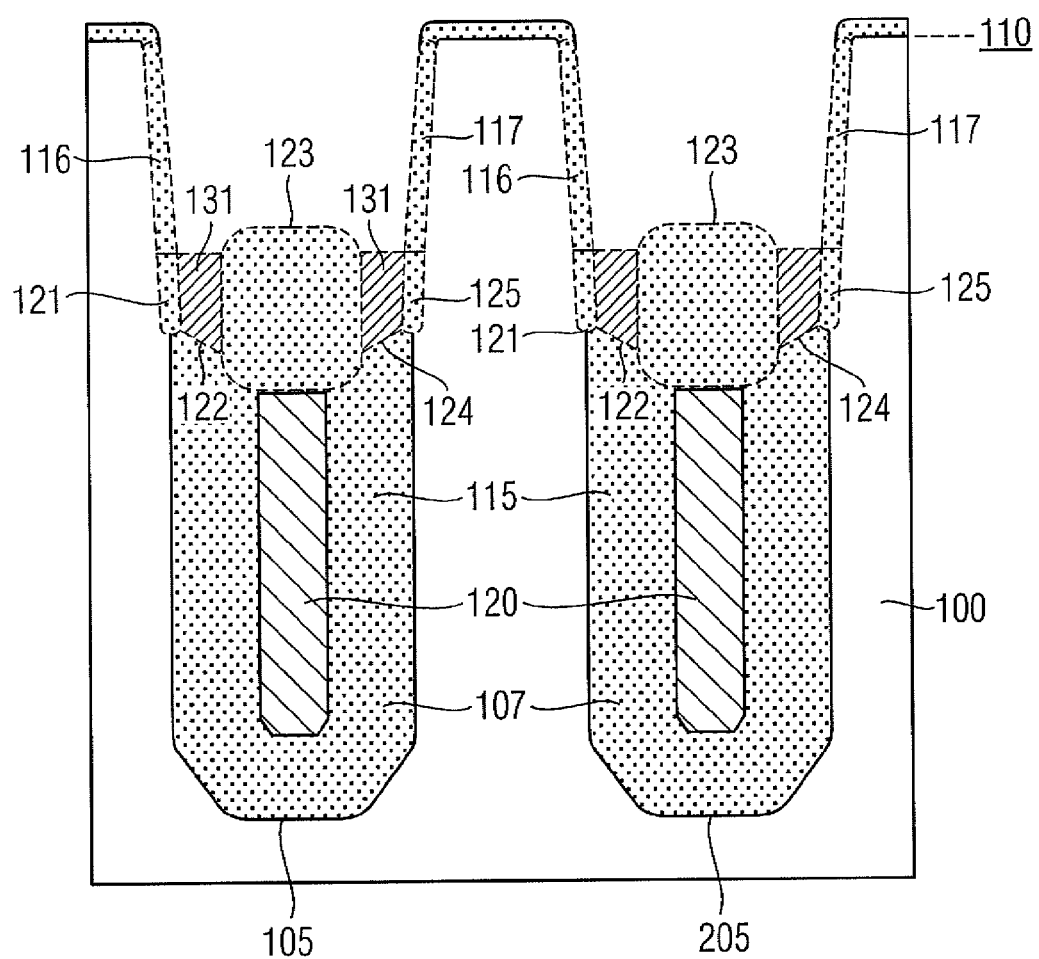
FIG. 11 is a cross-section of the semiconductor body for illustrating the process of selectively etching the silicon nitride to the oxide.

Referring to FIG. 11, the insulating material 131 is selectively etched to the material of regions 116, 117, 121, 123, 125, e.g. by wet etching or dry etching or a combination thereof. Etching may be stopped when the insulating material 131 is removed from a top side of the third region 123 but remains within the second and fourth regions 122, 124. Thus, a dielectric structure 115 within the trenches 105, 205, may include along the lateral direction of line AA', $SiO_2$ in the first region 121, $Si_3N_4$ being selectively etchable to $SiO_2$ in the second region 122, $SiO_2$ in the third region 123, $Si_3N_4$ in the fourth region 124 and $SiO_2$ in the fifth region 125.

Figure 12:
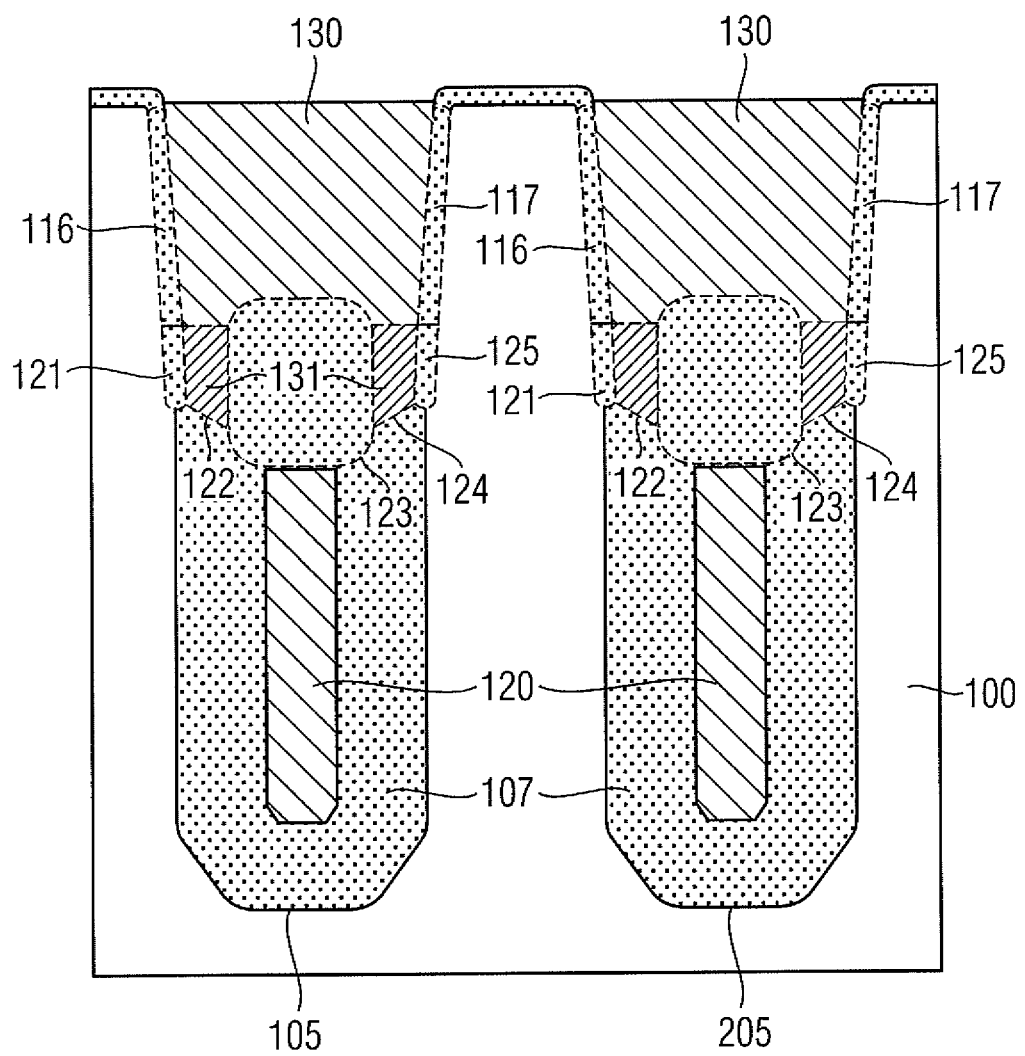
FIG. 12 is a cross-section of the semiconductor body for illustrating the process of forming a second conductive material in the trench.

Then, as is illustrated in FIG. 12, the trenches 105, 205 are filled with a conductive material such as doped polysilicon or another doped semiconductor material, metal or combinations thereof. The conductive material constitutes a second electrode that may function as a gate electrode. The conductive material may initially also be formed, e.g. deposited, on the main surface 110 followed by removing the conductive material from the main surface by an appropriate process such as chemical mechanical polishing (CMP), for example.

Figure 13:
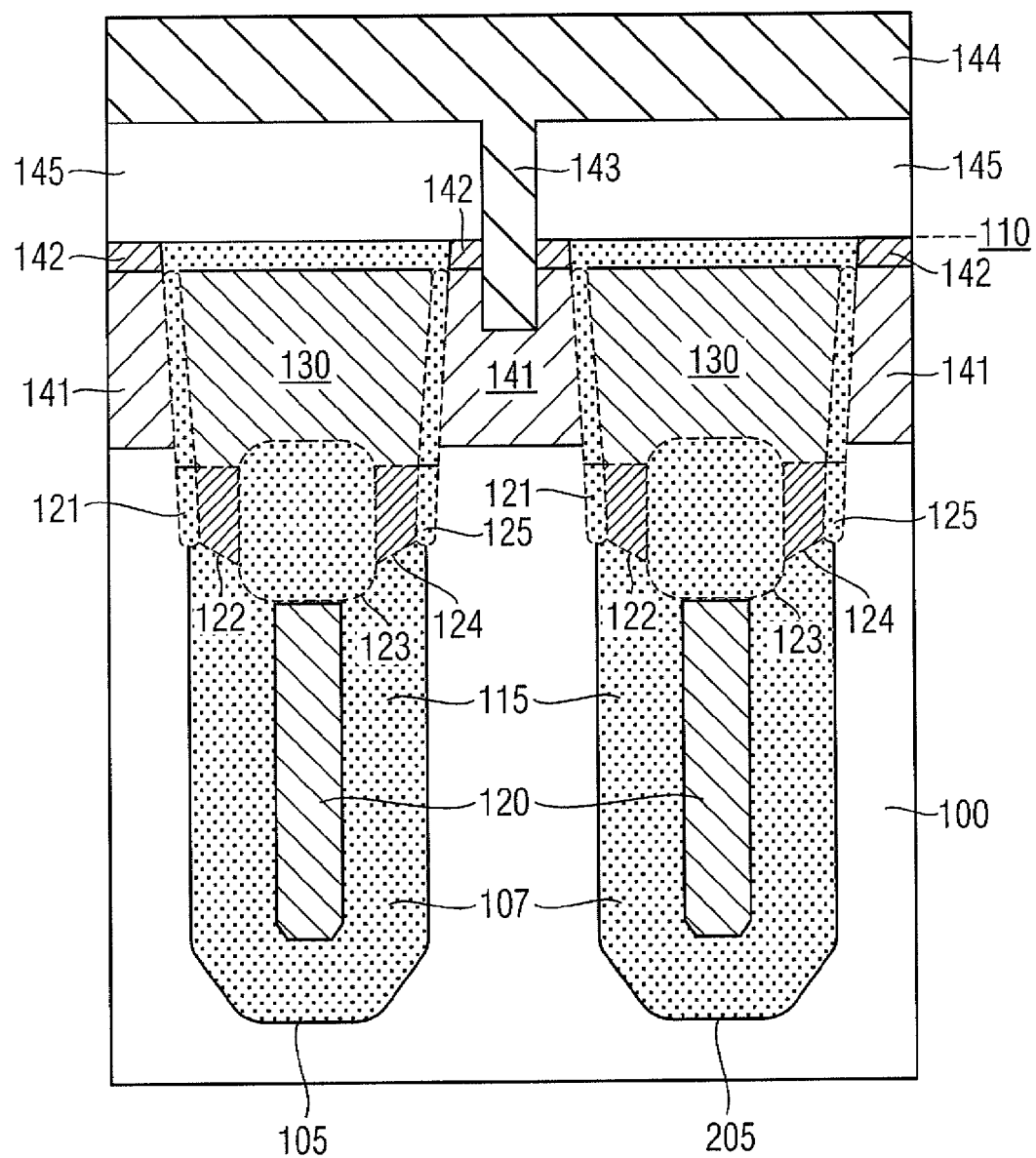
FIG. 13 is a cross-section of the semiconductor body for illustrating processes of manufacturing semiconductor regions within the semiconductor body and a wiring area on a main surface.

Referring to FIG. 13, further processes for finalizing the device are illustrated. These further processes include forming body regions 141, source regions 142, contact plugs 143 electrically coupling the source regions 142 and the body region 141 to a conductive material 144, e.g. a metal line, of a wiring area, the conductive material being electrically insulated from active areas within semiconductor body 100 and from the second electrode 130 by an interlayer insulator 145.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body including a trench, a first sidewall of the trench being opposed to a second sidewall of the trench;
a first electrode in a lower portion of the trench;
a second electrode in an upper portion of the trench;
a dielectric structure in the trench, the dielectric structure including a first portion between the first electrode and the second electrode; wherein
the first portion of the dielectric structure includes, in sequence along a lateral direction from the first sidewall to the second sidewall, a first part including a first dielectric material, a second part including a second dielectric material being selectively etchable to the first dielectric material, a third part including the first dielectric material, the first dielectric material of the third part being continuously arranged along a vertical direction from a top side of the first electrode to a bottom side of the second electrode, a fourth part including the second dielectric material and a fifth part including the first dielectric material; and wherein the top side of the first electrode is arranged below a bottom side of the second part.

2. The semiconductor device of claim 1, wherein the first dielectric material is an oxide of silicon.

3. The semiconductor device of claim 1, wherein the second dielectric material is a nitride of silicon.

4. The semiconductor device of claim 1, wherein the first electrode is a field electrode of a field effect transistor and the second electrode is a gate electrode of the field effect transistor.

5. The semiconductor device of claim 1, wherein a width of the second part along the lateral direction corresponds to a width of the fourth part along the lateral direction, the width being in a range of 10 nm to 900 nm.

6. The semiconductor device of claim 5, wherein a width of the first part along the lateral direction corresponds to a width of the fifth part along the lateral direction.

7. The semiconductor device of claim 1, wherein a material of a second portion of the dielectric structure adjoining to the first sidewall, to the second sidewall, and to a bottom side of the trench is the first dielectric material.

8. A semiconductor device, comprising:
a semiconductor body including a trench, a first sidewall of the trench being opposed to a second sidewall of the trench;
a first electrode in a lower portion of the trench;
a second electrode in an upper portion of the trench;
a dielectric structure in the trench, the dielectric structure including
a third portion between the first sidewall and an upper part of the first electrode, the third portion including, in sequence along a lateral direction from the first sidewall to the upper part of the first electrode, a first part including a first dielectric material, a second part including a second dielectric material being selectively etchable to the first dielectric material and a third part including the first dielectric material;
a fourth portion between the second sidewall and the upper part of the first electrode, the fourth portion including, in sequence along a lateral direction from the second sidewall to the upper part of the first electrode, a fourth part including the first dielectric material, a fifth part including the second dielectric material and a sixth part including the first dielectric material; wherein
the first dielectric material is continuously arranged along a vertical direction from a top side of the upper part of the first electrode to a bottom side of the second electrode; and wherein a width of the upper part of the first electrode is smaller than a width of a lower part of the first electrode.

9. The semiconductor device of claim 8, wherein the first dielectric material is an oxide of silicon.

10. The semiconductor device of claim 8, wherein the second dielectric material is a nitride of silicon.

11. The semiconductor device of claim 8, wherein the first electrode is a field electrode of a field effect transistor and the second electrode is a gate electrode of the field effect transistor.

12. The semiconductor device of claim 8, wherein a width of the second part along the lateral direction corresponds to a width of the fifth part along the lateral direction, the width being in a range of 10 nm to 900 nm.

13. The semiconductor device of claim 12, wherein a width of the first part along the lateral direction corresponds to a width of the fifth part along the lateral direction.

14. The semiconductor device of claim 8, wherein a fifth portion of the dielectric structure adjoining to the first sidewall, to the second sidewall, and to a bottom side of the trench is of the first material.

15. A method of manufacturing a semiconductor device, comprising:
forming a trench in a semiconductor body, a first sidewall of the trench being opposed to a second sidewall of the trench;
forming a first electrode in a lower portion of the trench;
forming a second electrode in an upper portion of the trench;

forming a dielectric structure in the trench, the dielectric structure including a first portion between the first electrode and the second electrode; wherein the first portion of the dielectric structure includes, in sequence along a lateral direction from the first sidewall to the second sidewall, a first part including a first dielectric material, a second part including a second dielectric material being selectively etchable to the first dielectric material, a third part including a third dielectric material, the first dielectric material of the third part being continuously arranged along a vertical direction from a top side of the first electrode to a bottom side of the second electrode, a fourth part including the second dielectric material and a fifth part including the first dielectric material; and wherein the top side of the first electrode is arranged below a bottom side of the second part.

16. The method of claim 15, wherein forming the first electrode and forming the dielectric structure comprise, in the following order:

forming a dielectric material in the trench, the dielectric material covering sidewalls and a bottom side of the trench;

forming a first electrode material in the trench; and etching the dielectric material at least until an upper side of the first dielectric material is closer to the bottom side than the upper side of the first electrode material.

17. The method of claim 16, further comprising:

forming the first dielectric material of the first, third and fifth part, respectively; and thereafter forming the second dielectric material in the second and fourth part, respectively.

18. The method of claim 17, wherein the first dielectric material is an oxide of silicon, the second dielectric material is a nitride of silicon and the first electrode material comprises doped polysilicon.

19. The method of claim 18, wherein forming the first dielectric material in the third part comprises oxidizing the first electrode material.

20. The method of claim 19, wherein the first dielectric material in the first and fifth part is a gate oxide.

21. The method of claim 18, wherein forming the second dielectric material comprises:

depositing the second dielectric material; and selectively etching the second dielectric material to the first dielectric material.

22. A method of manufacturing a semiconductor device, comprising forming a trench in a semiconductor body, a first sidewall of the trench being opposed to a second sidewall of the trench;

forming a first electrode in a lower portion of the trench;

forming a second electrode in an upper portion of the trench;

forming a dielectric structure in the trench, the dielectric structure including a third portion between the first sidewall and an upper part of the first electrode, the third portion including, in sequence along a lateral direction from the first sidewall to the upper part of the first electrode, a first part including a first dielectric material, a second part including a second dielectric material being selectively etchable to the first dielectric material and a third part including the first dielectric material; and forming a fourth portion between the second sidewall and the upper part of the first electrode, the fourth portion including, in sequence along a lateral direction from the second sidewall to the upper part of the first electrode, a fourth part including the first dielectric material, a fifth part including the second dielectric material and a sixth part including the first dielectric material; wherein the first dielectric material is continuously arranged along a vertical direction from a top side of the upper part of the first electrode to a bottom side of the second electrode; and wherein a width of the upper part of the first electrode is smaller than a width of a lower part of the first electrode.

23. The method of claim 22, wherein forming the first electrode and forming the dielectric structure comprise, in the following order:

forming a dielectric material in the trench, the dielectric material covering sidewalls and a bottom side of the trench;

forming a first electrode material in the trench; and etching the dielectric material at least until an upper side of the first dielectric material is closer to the bottom side than the upper side of the first electrode material.

24. The method of claim 23, further comprising:

forming the first dielectric material of the first, the third, the fourth and the sixth part, respectively; and thereafter forming the second dielectric material of the second and the fifth part, respectively, wherein forming the second dielectric material includes depositing the second dielectric material and selectively etching the second dielectric material to the first dielectric material.

25. The method of claim 24, wherein the first dielectric material is an oxide of silicon, the second dielectric material is a nitride of silicon and the first electrode material comprises doped polysilicon.

* * * * *